(12) United States Patent
Huang et al.

(10) Patent No.: US 9,143,243 B2
(45) Date of Patent: Sep. 22, 2015

(54) POWER MODULE FOR HIGH/LOW VOLTAGE INSULATION

(71) Applicant: Industrial Technology Research Institute, Hsinchu (TW)

(72) Inventors: Shin-Yi Huang, Taichung (TW); Wen-Chih Chen, Hsinchu County (TW); Tao-Chih Chang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 244 days.

(21) Appl. No.: 14/018,434

(22) Filed: Sep. 5, 2013

(65) Prior Publication Data

US 2014/0374629 A1 Dec. 25, 2014

(30) Foreign Application Priority Data

Jun. 20, 2013 (TW) .............................. 102121988 A

(51) Int. Cl.
*H04B 10/80* (2013.01)
*H01L 23/00* (2006.01)

(52) U.S. Cl.
CPC .............. *H04B 10/802* (2013.01); *H01L 24/34* (2013.01); *H01L 2924/15787* (2013.01); *H01L 2924/15788* (2013.01)

(58) Field of Classification Search
CPC ................. H04B 10/802; H01L 24/34; H01L 2924/15787; H01L 2924/15788
USPC .............. 250/551; 385/14, 32–36; 257/74–82
See application file for complete search history.

(56) References Cited

U.S. PATENT DOCUMENTS

| 5,647,034 A | 7/1997 | Matsuda et al. |
| 6,025,610 A | 2/2000 | Kusaka et al. |
| 6,724,376 B2 | 4/2004 | Sakura et al. |
| 6,754,407 B2 | 6/2004 | Chakravorty et al. |
| 6,897,487 B2 | 5/2005 | Yamaguchi |
| 7,919,849 B2 | 4/2011 | Kodama et al. |
| 8,120,040 B2 | 2/2012 | Asai et al. |

(Continued)

FOREIGN PATENT DOCUMENTS

| TW | 200743194 | 11/2007 |
| TW | 200908241 | 2/2009 |

OTHER PUBLICATIONS

Castellazzi, A. et al., "Electro-Thermal Model of a High-Voltage IGBT Module for Realistic Simulation of Power Converters," 37th European Solid State Device Research Conference, Sep. 11-13, 2007, pp. 155-158.

(Continued)

*Primary Examiner* — Seung C Sohn
(74) *Attorney, Agent, or Firm* — Jianq Chyun IP Office

(57) ABSTRACT

A power module for high/low voltage insulation is provided. The power module includes a first substrate, a second substrate and an insulating substrate. The first substrate includes a first control circuit and a light source, wherein the first control circuit controls the light source to emit light. The second substrate includes a light-sensing part, a second control circuit and a power device. The light-sensing part receives the light of the light source of the first substrate to send a sensing information. The second control circuit correspondingly drives the power device in accordance with the sensing information. The insulating substrate is disposed between the first substrate and second substrate.

20 Claims, 11 Drawing Sheets

(56) References Cited

U.S. PATENT DOCUMENTS

| | | | |
|---|---|---|---|
| 2001/0038081 A1* | 11/2001 | De Wulf | 250/551 |
| 2005/0098743 A1* | 5/2005 | Tanabe et al. | 250/551 |
| 2008/0247703 A1 | 10/2008 | Kodama et al. | |
| 2008/0247704 A1 | 10/2008 | Kodama et al. | |
| 2009/0014669 A1* | 1/2009 | Sato et al. | 250/551 |
| 2010/0181506 A1* | 7/2010 | Brutschin et al. | 250/551 |

OTHER PUBLICATIONS

Tang Jing et al., "The Model of IGBT as a Power Switch," International Conference on Electronics, Communications and Control (ICECC), Sep. 9-11, 2011, pp. 1720-1723.

Lwamoto, H. et al., "New generation 1200V power module with trench gate IGBT and super soft recovery diode and its evaluations," IEE Proceedings—Electric Power Applications, vol. 147, Issue 3, May 2000, pp. 153-158.

Ozan Aktan et al., "Optoelectronic CMOS Power Supply Unit for Electrically Isolated Microscale Applications," IEEE Journal of Selected TOPISC in Quantum Electronics, vol. 17, No. 3, May/Jun. 2011, pp. 747-756.

Lee et al., "The Low-power and Low-Area PWM by Light Intensity for Photoflash in 0.35-um CMOS," IEEE International Symposium on Circuits and Systems, May 18-21, 2008, pp. 1724-1727.

* cited by examiner

POWER MODULE FOR HIGH/LOW VOLTAGE INSULATION

CROSS-REFERENCE TO RELATED APPLICATION

This application claims the priority benefit of Taiwan application serial no. 102121988, filed on Jun. 20, 2013. The entirety of the above-mentioned patent application is hereby incorporated by reference herein and made a part of this specification.

TECHNICAL FIELD

The present disclosure relates to a power module for high/low voltage insulation.

BACKGROUND

In conventional art, the power module is composed of control circuit in the low voltage domain and power transistor in the high voltage domain, which are assembled on the same circuit board by a solder-bonding method. However, when the high voltage VH is greater than 1200V, in the power module of conventional art, an electrical kickback may occur during operation of the power transistor due to a reason that a low voltage domain circuit and a high voltage domain circuit being disposed on the same circuit board, which results in failure for driving IC.

SUMMARY

The present disclosure provides a power module for high/low voltage insulation, including a first substrate, a second substrate and an insulating substrate.

The first substrate includes a first control circuit and a light source, wherein the first control circuit controls the light source to emit light. The second substrate is disposed on a side of the first substrate. The second substrate includes a light-sensing part, a second control circuit and a power device. The light-sensing part receives the light of the light source of the first substrate to send sensing information. The second control circuit correspondingly drives the power device in accordance with the sensing information. The insulating substrate is disposed between the first substrate and second substrate.

Several exemplary embodiments accompanied with figures are described in detail below to further describe the disclosure in details.

BRIEF DESCRIPTION OF THE DRAWINGS

The accompanying drawings are included to provide a further understanding of the present disclosure, and are incorporated in and constitute a part of this specification. The drawings illustrate exemplary embodiments and, together with the description, serve to explain the principles of the present disclosure.

DETAILED DESCRIPTION OF DISCLOSED EMBODIMENTS

Figure 1:
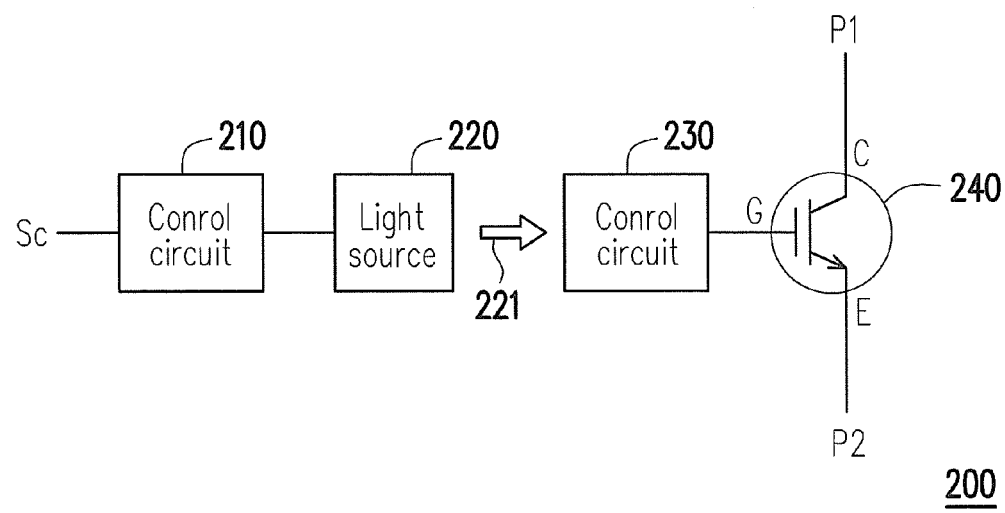
FIG. 1 is a schematic circuit diagram of a power module for high/low voltage insulation according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." Moreover, wherever appropriate in the drawings and embodiments, elements/components/devices/steps with the same reference numerals represent the same or similar parts. Elements/components/devices/steps with the same reference numerals or names in different embodiments may be cross-referenced.

FIG. 1 is a schematic circuit diagram of a power module 200 for high/low voltage insulation according to an embodiment of the present disclosure. The power module 200 for high/low voltage insulation includes a first control circuit 210, a light source 220, a second control circuit 230 and a power device 240. The first control circuit 210 and the light source 220 are disposed on a first substrate, and the second control circuit 230 and the power device 240 are disposed on a second substrate. The operating voltage of the first substrate is a low voltage, and the operating voltage of the second substrate is a high voltage. The power device of the second substrate with high voltage is not electrically connected to the first substrate. Therein, the operating voltage of the power device 240 is greater than 10 times the operating voltage of the first substrate. Other details of implementation regarding the first substrate and the second substrate will be described later.

Operating voltages of the first control circuit 210 and the light source 220 is a low voltage (e.g., less than 10V). The first control circuit 210 controls the light source 220. The implementation of light source 220 is not particularly limited by the present embodiment. For instance, the light source 220 can include a light emitting diode (LED) or other light emitting components, so as to provide visible light or non-visible light (e.g., ultraviolet, infra red and so on). In the present embodiment, a wavelength of the light source 220 can be between 300 nm to 1000 nm. Based on the control signal Sc in low voltage, the first control circuit 210 can correspondingly control the light source 220 to modulate light 221 of the light source 220. Therefore, the light 221 carries the control signal Sc.

Operating voltages of the second control circuit 230 and the power device 240 is a high voltage. For instance, the operating voltage of the second control circuit 230 can be greater than 10V, and the operating voltage of the power device 240 can be greater than 600V (or even greater than 1200V). The second control circuit 230 includes a light-sensing part. For instance, the light-sensing part includes a photodiode or other light-sensing devices, so as to sense the light 221 emitted by the light source 220. The light-sensing part can sense the light 221 emitted by the light source 220, so as to demodulate the control signal Sc from the light 221. The second control circuit 230 correspondingly controls the power device 240 in accordance with a sensing result (sensing information) of the light-sensing part. Therefore, the control signal Sc is capable of controlling the power device 240.

The power device 240 includes a transistor, in which a control terminal of the transistor is electrically connected to the second control circuit 230, a first terminal of the transistor is electrically connected to a first electrode pad P1 of the second substrate, and a second terminal of the transistor is electrically connected to a second electrode pad P2 of the second substrate. The transistor can be any type of transistors such as a metal-oxide-semiconductor (MOS) transistor, an insulated gate bipolar transistor (IGBT), a bipolar junction transistor (BJT) or other power transistors. For instance, the power device 240 depicted in FIG. 1 includes the IGBT, in which a gate G of the IGBT is served as a control terminal of the power device 240, a collector C of the IGBT is served as a first terminal of the power device 240 electrically connected to the first electrode pad P1 of the second substrate, and an emitter E of the IGBT is served as a second terminal of the power device 240 electrically connected to the second electrode pad P2 of the second substrate. In other embodiments, the emitter E can be changed to electrically connect the first electrode pad P1, and the collector C can be changed to electrically connect the second electrode pad P2.

The first electrode pad P1 and the second electrode pad P2 can be electrically connected to a high operating voltage (e.g., 1200V) and a load (e.g., motor or other devices). When the power device 240 is turned on, a high operating voltage can provide electricity to the load though the power device 240. It is required for the power device 240 to endure high voltage and high current. Since an electrical path is not present between the first control circuit 210 operated in a lower voltage domain and the power device 240 operated in a high voltage domain, a situation in which an electrical noise or a pulse in the high voltage domain that bolts back to the first control circuit 210 in the low voltage domain from the power device 240 can be prevented.

The power module 200 for high/low voltage insulation depicted in FIG. 1 can be applied to circuits of any products. For instance, the power module 200 for high/low voltage insulation can be applied to a driving circuit of an electric vehicle (EV), so as to drive/control a vehicle motor therein.

Figure 2:
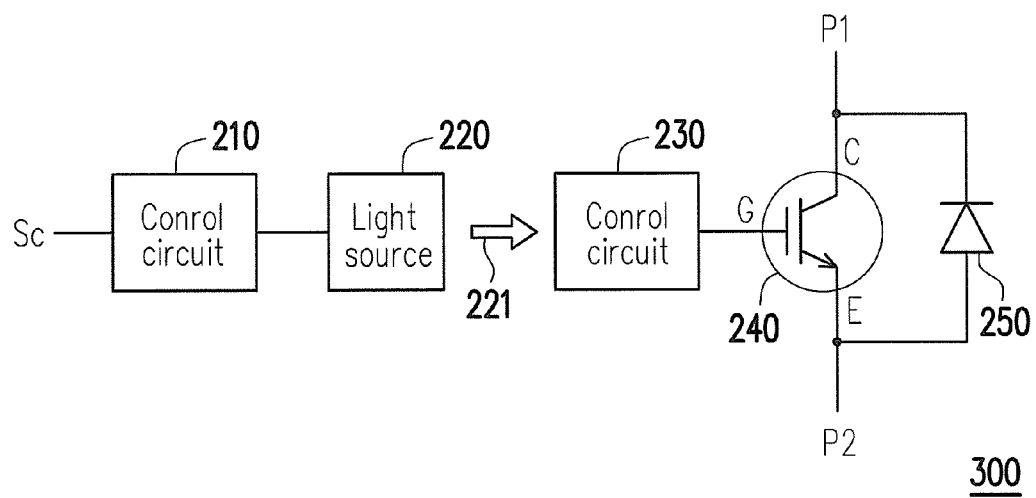
FIG. 2 is a schematic circuit diagram of a power module for high/low voltage insulation according to another embodiment of the present disclosure.

The implementation of the present disclosure shall not be limited by related description for FIG. 1. For instance, FIG. 2 is a schematic circuit diagram of an power module 300 for high/low voltage insulation according to another embodiment of the present disclosure. The embodiment depicted in FIG. 2 may be inferred with reference to related description for FIG. 1. A difference between the present embodiment and the embodiment depicted in FIG. 1 is that, the power module 300 for high/low voltage insulation depicted in FIG. 2 further includes a diode 250. A first terminal and a second terminal of the diode 250 are electrically connected to a first terminal and a second terminal of the power device 240, respectively. In the embodiment depicted in FIG. 2, a cathode of the diode 250 is electrically connected to the first electrode pad P1, and an anode of the diode 250 is electrically connected to the second electrode pad P2. However, the implementation of the diode 250 shall not be limited by related description for FIG. 2. For instance, in other embodiments, the anode of the diode 250 can be changed to electrically connect the first electrode pad P1, and the cathode of the diode 250 can be changed to electrically connect the second electrode pad P2.

Figure 3A:
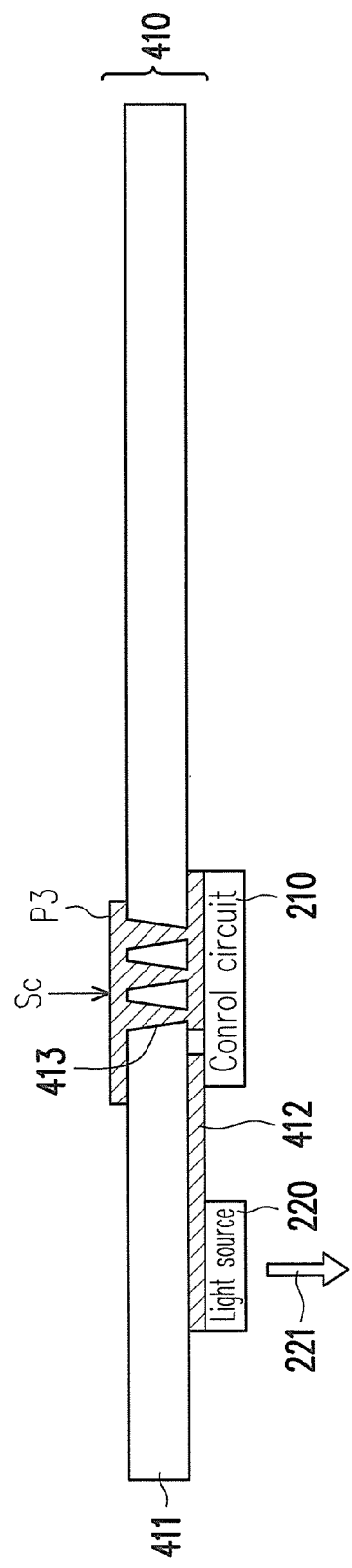
FIG. 3A is a cross-sectional diagram of a structure of a first substrate including the first control circuit and the light source depicted in FIG. 2 according to an embodiment of the present disclosure.

FIG. 3A is a cross-sectional diagram of a structure of a first substrate 410 including the first control circuit 210 and the light source 220 depicted in FIG. 2 according to an embodiment of the present disclosure. The embodiment depicted in FIG. 3A may be inferred with reference to related description for FIG. 1 or 2. The first substrate 410 is a low voltage substrate. The first substrate 410 can be a ceramic substrate, a glass substrate, printed circuit board (PCB) or other substrates. The ceramic substrate can be a direct bond copper (DBC) ceramic substrate, a copper electroplating ceramic substrate or other ceramic substrates.

The first substrate 410 includes the first control circuit 210, the light source 220, a substrate 411, a conductive layer 412, a conductive through via structure 413 and a control electrode pad P3. The conductive layer 412 is disposed on a first side of the substrate 411, and the control electrode pad P3 is disposed on a second side of the substrate 411. The conductive through via structure 413 is disposed in the substrate 411 of the first substrate 410 to electrically connect the control electrode pad P3 to the first control circuit 210. Therefore, the first control circuit 210 can receive the control signal Sc in low voltage domain though the conductive through via structure 413 and the control electrode pad P3. The first control circuit 210 and the light source 220 are electrically connected to the conductive layer 412. The first control circuit 210 controls the light source 220 to correspondingly generate the light 221. Based on different design requirements, the first control circuit 210 and the light source 220 can be soldered/bonded on the first substrate 410 though a conductive interface (e.g., metal glue, metal paste, nano-silver paste, tin or other conductive materials).

Figure 3B:
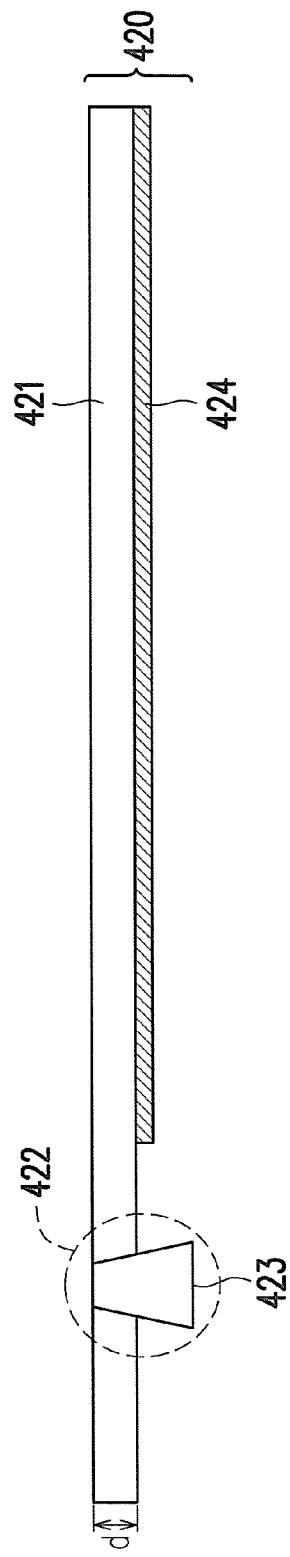
FIG. 3B is a cross-sectional diagram of a structure of an insulating substrate including a light path according to an embodiment of the present disclosure.

FIG. 3B is a cross-sectional diagram of a structure of an insulating substrate 420 including a light path 422 according to an embodiment of the present disclosure. The insulating substrate 420 can be a ceramic interposer, a glass interposer or other substrates with high resistance characteristic. The insulating substrate 420 includes a substrate 421, a transparent component 423 and a conductive layer 424. In case that the substrate 421 is the ceramic interposer, a thickness d of the substrate 421 is greater than 250 μm. In the present embodiment, the thickness d of the substrate 421 can be greater than or equal to 300 μm. In the embodiment depicted in FIG. 3B, the insulating substrate 420 includes the conductive layer 424, and the conductive layer 424 can serve in use for electrical connection.

In the embodiment depicted in FIG. 3B, the insulating substrate 420 includes a through hole, and the transparent component 423 is disposed in the through hole. The light path 422 passes through the through hole and the transparent component 423. The length of the transparent component 423 is greater than the thickness d of the substrate 421 of the insulating substrate 420. In the present embodiment, a material of the transparent component 423 includes glass, plastic or other transparent materials. However, an implementation of the light path 422 is not limited thereto. For instance, in other embodiments, a material of the insulating substrate 420 can be a transparent material (e.g., glass or other transparent materials), so that the through hole is not required to be disposed on the insulating substrate 420. In case the insulating substrate 420 is transparent, the light path 422 is capable of passing through the insulating substrate 420.

Figure 3C:
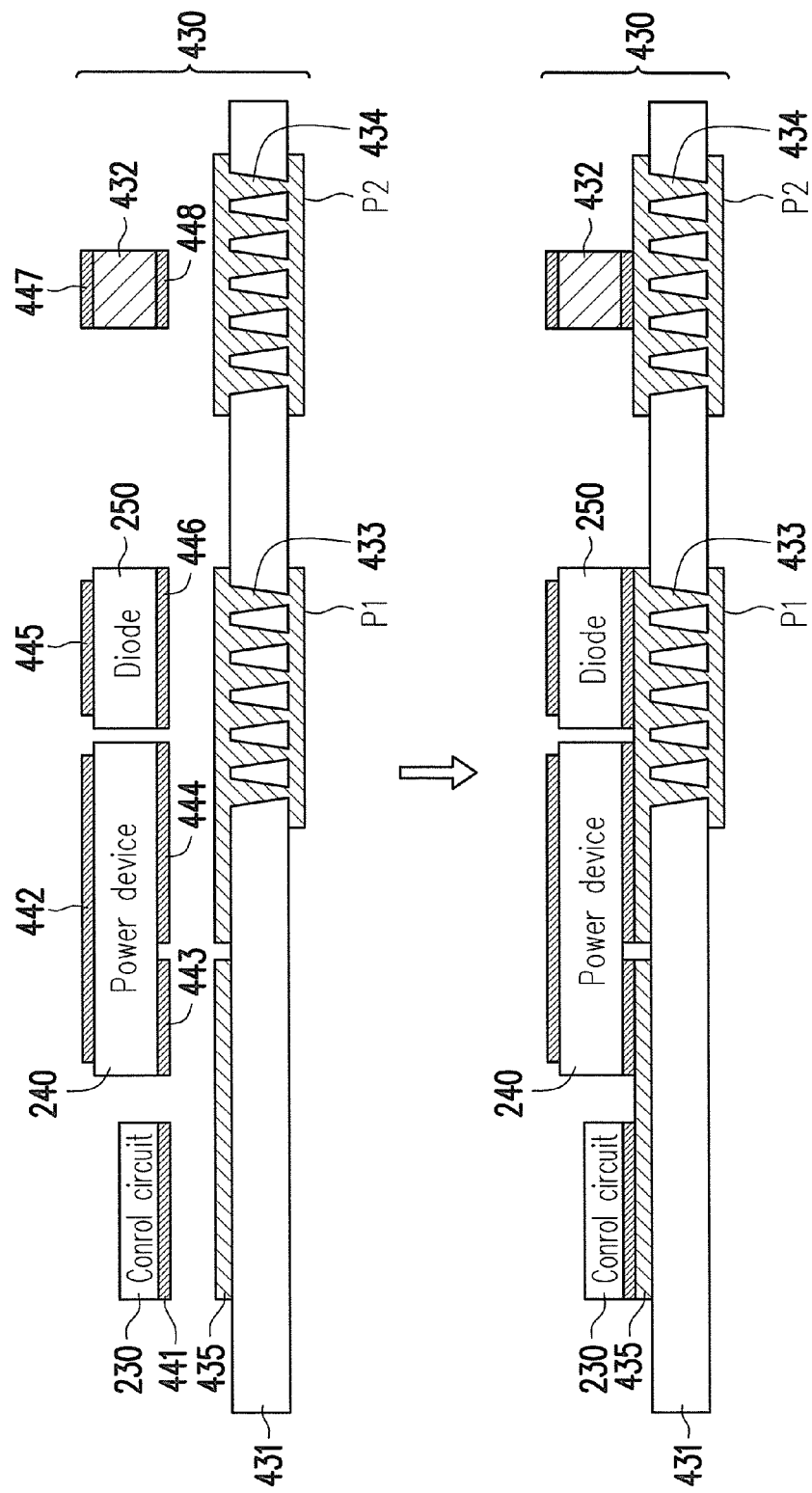
FIG. 3C is a cross-sectional diagram of a structure of a second substrate including the second control circuit and the power device depicted in FIG. 2 according to an embodiment of the present disclosure.

FIG. 3C is a cross-sectional diagram of a structure of a second substrate 430 including the second control circuit 230 and the power device 240 depicted in FIG. 2 according to an embodiment of the present disclosure. The embodiment depicted in FIG. 3C may be inferred with reference to related description for FIG. 1 or 2. The second substrate 430 is a high voltage substrate. The second substrate 430 can be a ceramic substrate, a glass substrate, PCB or other substrates. The ceramic substrate can be a DBC ceramic substrate, a copper electroplating ceramic substrate or other ceramic substrates.

The second substrate 430 includes the second control circuit 230, the power device 240, the diode 250, a substrate 431, at least one conductive pillar 432, a first conductive through via structure 433, a second conductive through via structure 434, a conductive layer 435, the first electrode pad P1 and the second electrode pad P2. The second control circuit 230, the power device 240, the diode 250, the conductive pillar 432 and the conductive layer 435 are disposed on a first side of the substrate 431, the first electrode pad P1 and the second electrode pad P2 are disposed at a second side of the substrate 431. The first conductive through via structure 433 and the second conductive through via structure 434 are disposed in the substrate 431 of the second substrate 430.

Connecting terminals of the second control circuit 230, the power device 240, the diode 250 and the conductive pillar 432 are coated with conductive interfaces 441, 442, 443, 444, 445, 446, 447 and 448, respectively, as illustrated in FIG. 3C. The conductive interfaces can be any conductive material, such as metal glue, metal paste, nano-silver paste, tin or other conductive materials for soldering/bonding. The second control circuit 230 is electrically soldered/bonded on the conductive layer 435 of the second substrate 430 through the conductive interface 441. The control terminal and the first terminal of the power device 240 are disposed on a first side of the power device 240, and the second terminal of the power device 240 is disposed on a second side of the power device 240. The control terminal of the power device 240 is electrically soldered/bonded on the conductive layer 435 through the conductive interface 443, so as to be electrically connected the second control circuit 230. The first terminal of the power device 240 is electrically contacted to the first conductive through via structure 433 through the interface 444. The diode 250 is electrically contacted to the first conductive through via structure 433 through the interface 446. The first conductive through via structure 433 can electrically connect the first electrode pad P1 to the power device 240 and the diode 250.

The conductive pillar 432 can be a copper pillar or other metal pillars. The conductive pillar 432 is electrically contacted to the second conductive through via structure 434 through the interface 448. The second conductive through via structure 434 can electrically connect the second electrode pad P2 to the conductive pillar 432.

Figure 4:
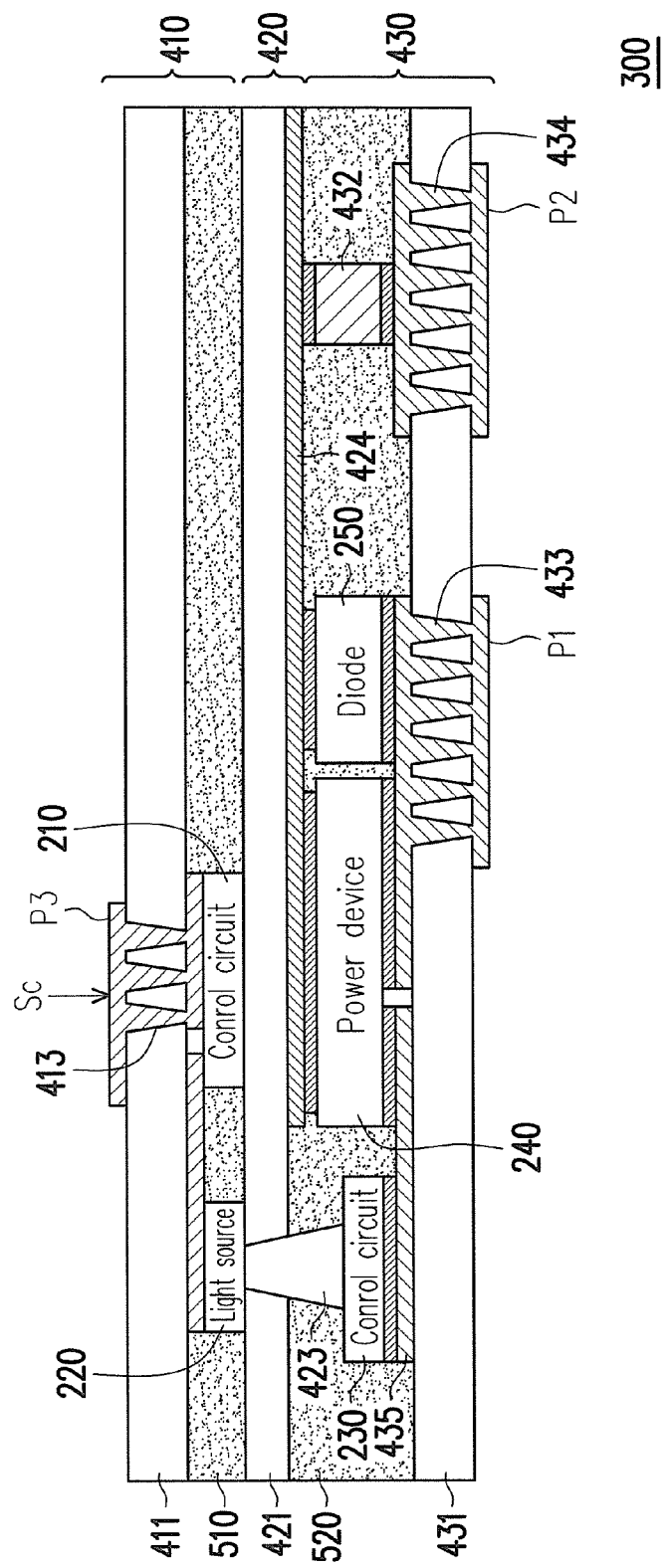
FIG. 4 is a cross-sectional diagram of a structure of the power module for high/low voltage insulation depicted in FIG. 2 according to an embodiment of the present disclosure.

The first substrate 410 depicted in FIG. 3A, the insulating substrate 420 depicted in FIG. 3B and the second substrate 430 depicted in FIG. 3C can be stacked to realize the power module 300 for high/low voltage insulation depicted in FIG. 2. For instance, FIG. 4 is a cross-sectional diagram of a structure of the power module 300 for high/low voltage insulation depicted in FIG. 2 according to an embodiment of the present disclosure. The embodiment depicted in FIG. 4 may be inferred with reference to related description for FIGS. 1, 2, 3A, 3B, and/or 3C. Referring to FIG. 4, the second substrate 430 is disposed on a first side of the first substrate 410, and the power device 240 of the second substrate 430 is not electrically connected to the control circuit on the first substrate 410 directly. The insulating substrate 420 is disposed between the first substrate 410 and the second substrate 430. The first control circuit 210 and the light source 220 are disposed between the first substrate 410 and the insulating substrate 420. The second control circuit 230, the power device 240, the diode 250 and the conductive pillar 432 are disposed between the second substrate 430 and the insulating substrate 420. The light of the light source 220 of the first substrate 410 is transmitted to the light-sensing part of the second control circuit 230 of the second substrate 430.

The second terminal of the power device 240 is soldered to the conductive layer 424 of the insulating substrate 420 through the conductive interface 442. The diode 250 is electrically soldered/bonded on the conductive layer 424 of the insulating substrate 420 through the conductive interface 445. The conductive pillar 432 is electrically connected to the conductive layer 424 of the insulating substrate 420 through the conductive interface 447. Therefore, the first conductive through via structure 433 can electrically connect the first electrode pad P1 to the first terminals of the power device 240 and the diode 250, and the second conductive through via structure 434 and the conductive pillar 432 can electrically connect the second electrode pad P2 to the second terminals of the power device 240 and the diode 250.

The through hole of the insulating substrate 420 and the transparent component 423 can provide the light path between the first substrate 410 and the second substrate 430. Therein, the light source 220 is disposed on the first end of the light path, and the light-sensing part of the second control circuit 230 is disposed on a second end of the light path. The light path can transmit the light of the light source 220 of the first substrate 410 to the light-sensing part of the second control circuit 230 of the second substrate 430. The second control circuit 230 correspondingly controls the power device 240 in accordance with a sensing result (sensing information) of the light-sensing part.

The power module 300 for high/low voltage insulation depicted in FIG. 4 further includes a first dielectric layer 510 and a second dielectric layer 520. The first dielectric layer 510 is disposed between the first substrate 410 and the insulating substrate 420. The second dielectric layer 520 is disposed between the second substrate 430 and the insulating substrate 420. A material of the first dielectric layer 510 and/or the second dielectric layer 520 can be any high-molecular material such as silica gel, prepreg, ABF (Ajinomoto build-up film, product name, produced by Japanese Ajinomoto, which is an epoxy resin containing glass particles), polyimide or other materials. The material of the first dielectric layer 510 and/or the second dielectric layer 520 can also be a non-fiber resin material. In some embodiments, when the material of the first dielectric layer 510 and the second dielectric layer 520 are transparent, the transparent component 423 can be omitted according to design requirements.

When the power module 300 for high/low voltage insulation is composed by having all components embedded, an electrical transmission path between said all components can be effectively reduced to provide an effect of miniaturization in packaging size. Since there is no electrical connection between the first substrate 410 in the low voltage domain and the second substrate 430 in the high voltage domain, an electrical kickback occurred during operation of power device 240 and the diode 250 can be solved to prevent function failures. Besides, in the present embodiment, the low voltage domain circuit and the high voltage domain circuit are respectively disposed on the first substrate 410 and the second substrate 430, and the insulating substrate 420 is disposed between the first substrate 410 and the second substrate 430, such that the low voltage domain circuit and the high voltage domain circuit can be effectively insulated. The insulating substrate 420 is capable of enhancing a long term reliability of the power module 300 for high/low voltage insulation.

An example of manufacturing the power module 300 for high/low voltage insulation depicted in FIG. 4 is described below. In the present embodiment, nano-silver paste is served as an exemplary material for the conductive interface. First, the first substrate 410 depicted in FIG. 3A, the insulating substrate 420 depicted in FIG. 3B and the second substrate 430 depicted in FIG. 3C are manufactured. Therein, the nano-silver is coated on the connecting terminals of the second control circuit 230, the power device 240, the diode 250 and upper and lower ends of the conductive pillar 432 (or the nano-silver paste is printed on corresponding locations on the substrate 431), and then the second control circuit 230, the power device 240, the diode 250 and the conductive pillar 432 are bonded on the corresponding locations on the substrate 431, so as to complete the second substrate 430. Lastly, after the first substrate 410, the insulating substrate 420 and the second substrate 430 are stacked and assembled, a material (a molding material) of a dielectric layer is introduced, and followed by pressurizing and baking so that the nano-silver is sintered to complete an interconnection.

Figure 5A:
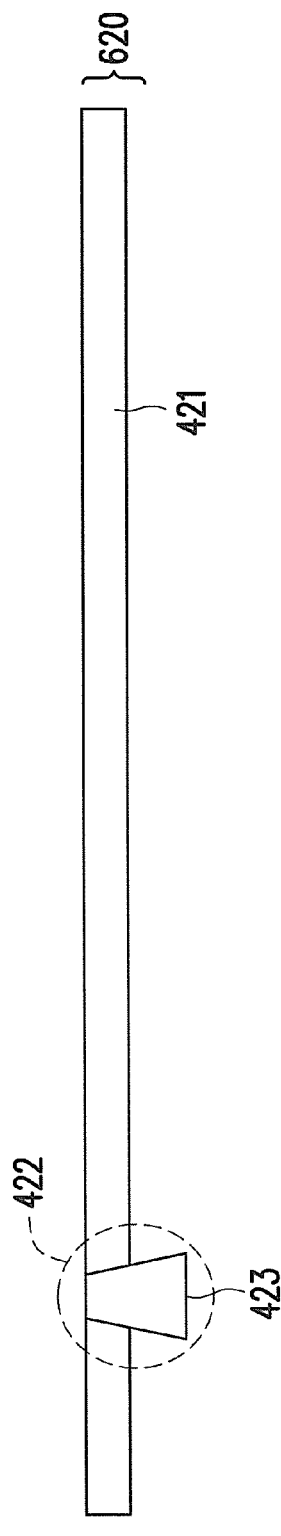
FIG. 5A is a cross-sectional diagram of a structure of an insulating substrate including the light path according to another embodiment of the present disclosure.
Figure 5B:
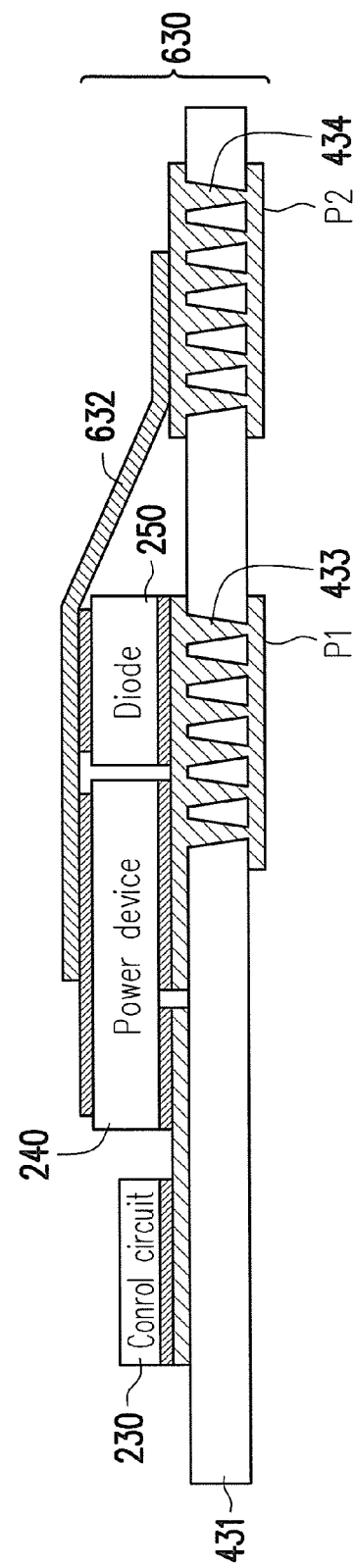
FIG. 5B is a cross-sectional diagram of a structure of a second substrate including the second control circuit and the power device depicted in FIG. 2 according to another embodiment of the present disclosure.
Figure 6:
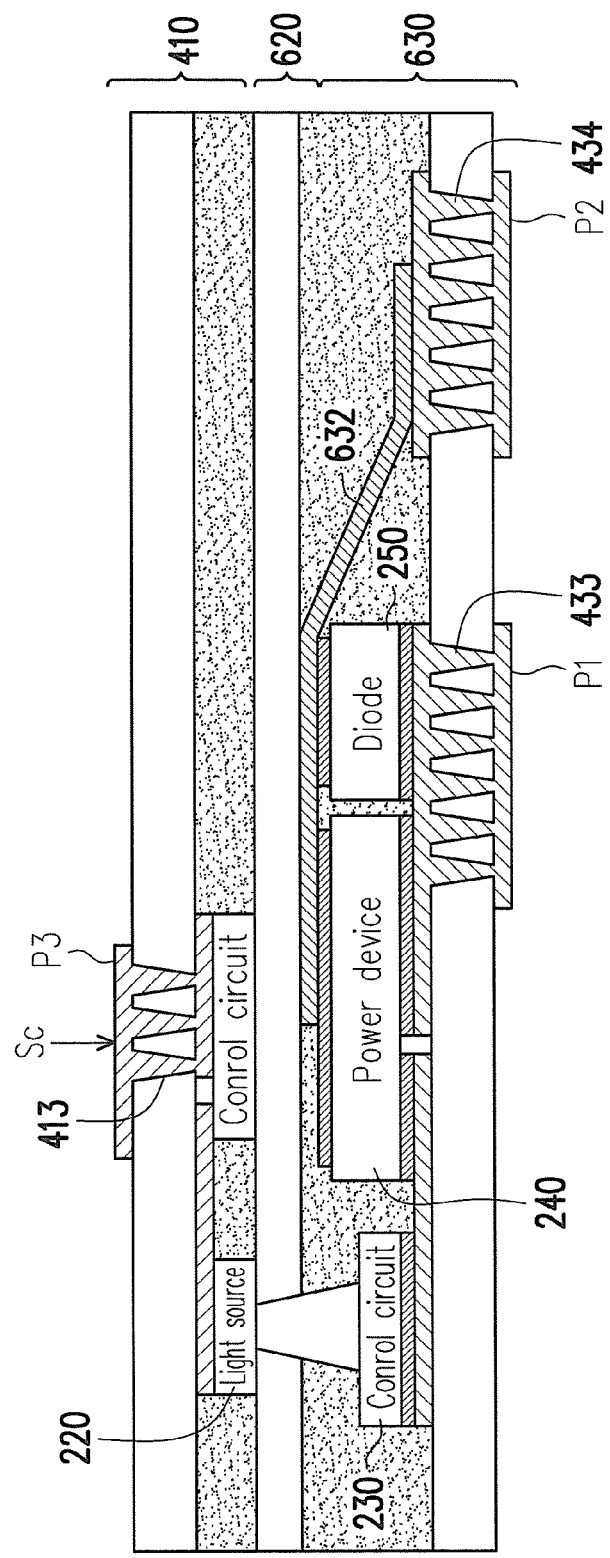
FIG. 6 is a cross-sectional diagram of a structure of the power module for high/low voltage insulation depicted in FIG. 2 according to another embodiment of the present disclosure.

The power module 300 for high/low voltage insulation depicted in FIG. 2 shall not be limited by related description for FIG. 4. For instance, FIGS. 5A, 5B and 6 illustrate another implementations of the power module 300 for high/low voltage insulation depicted in FIG. 2. FIG. 5A is a cross-sectional diagram of a structure of an insulating substrate 620 including the light path 422 according to another embodiment of the present disclosure. The insulating substrate 620 can be a ceramic interposer, a glass interposer or other substrates with high resistance characteristic. The insulating substrate 620 includes the substrate 421 and the transparent component 423. The embodiment depicted in FIG. 5A may be inferred with reference to related description for FIG. 3B, so it is omitted hereinafter. A difference between the present embodiment and the embodiment depicted in FIG. 3B is that, the conductive layer 424 depicted in FIG. 3B is omitted in the insulating substrate 620 depicted in FIG. 5A. In case a material of the substrate 421 of the insulating substrate 620 is also a transparent material, a light transmittance of the transparent component 423 can be different to a light transmittance of the substrate 421 of the insulating substrate 620.

FIG. 5B is a cross-sectional diagram of a structure of a second substrate 630 including the second control circuit 230 and the power device 240 depicted in FIG. 2 according to another embodiment of the present disclosure. The embodiment depicted in FIG. 5B may refer to related description for FIG. 1 or 2. The second substrate 630 depicted in FIG. 5B may be inferred with reference to related description for the second substrate 430 depicted in FIG. 3C, so it is omitted hereinafter. A difference between the present embodiment and the embodiment depicted in FIG. 3C is that, the conductive pillar 432 depicted in FIG. 3C is omitted in the second substrate 630 depicted in FIG. 5B, and at least one conductive wire 632 is disposed on the second substrate 630 depicted in FIG. 5B. A material of the conductive wire 632 can be an aluminum strip, a copper line or any metal materials. By using a bonding wire method, a first end of the conductive wire 632 is electrically connected to the second terminals of the power device 240 and the diode 250, and a second end of the conductive wire 632 is electrically connected to the second conductive through via structure 434.

The first substrate 410 depicted in FIG. 3A, the insulating substrate 620 depicted in FIG. 5A and the second substrate 630 depicted in FIG. 5B can be stacked to realize the power module 300 for high/low voltage insulation depicted in FIG. 2. For instance, FIG. 6 is a cross-sectional diagram of a structure of the power module 300 for high/low voltage insulation depicted in FIG. 2 according to another embodiment of the present disclosure. The embodiment depicted in FIG. 6 may be inferred with reference to related description for FIGS. 1, 2, 3A, 5A, and/or 5B, so it is omitted hereinafter. Referring to FIG. 6, the conductive wire 632 is disposed between the second substrate 630 and the insulating substrate 620. The first conductive through via structure 433 can electrically connect the first electrode pad P1 to the first terminals of the power device 240 and the diode 250, and the second conductive through via structure 434 and the conductive wire 632 can electrically connect the second electrode pad P2 to the second terminals of the power device 240 and the diode 250.

An example of manufacturing the power module 300 for high/low voltage insulation depicted in FIG. 6 is described below. In the present embodiment, nano-silver paste is served as an exemplary material for the conductive interface. First, the first substrate 410 depicted in FIG. 3A, the insulating substrate 620 depicted in FIG. 5A and the second substrate 630 depicted in FIG. 5B are manufactured. Therein, the nano-silver is coated on the connecting terminals of the second control circuit 230, the power device 240, the diode 250 (or the nano-silver paste is printed on corresponding locations on the substrate 431), and then the second control circuit 230, the power device 240, the diode 250 are bonded on the corresponding locations on the substrate 431. Subsequently, the first end of the conductive wire 632 (e.g., the aluminum strip) is pressed to the second control circuit 230 and the power device 240, and the second end of the conductive wire 632 is pressed to the second conductive through via structure 434. Thus, manufacturing of the second substrate 630 is completed. Lastly, after the first substrate 410, the insulating substrate 620 and the second substrate 630 are stacked and assembled, a material (a molding material) of a dielectric layer is introduced, and followed by pressurizing and baking so that the nano-silver is sintered to complete an interconnection.

Figure 7:
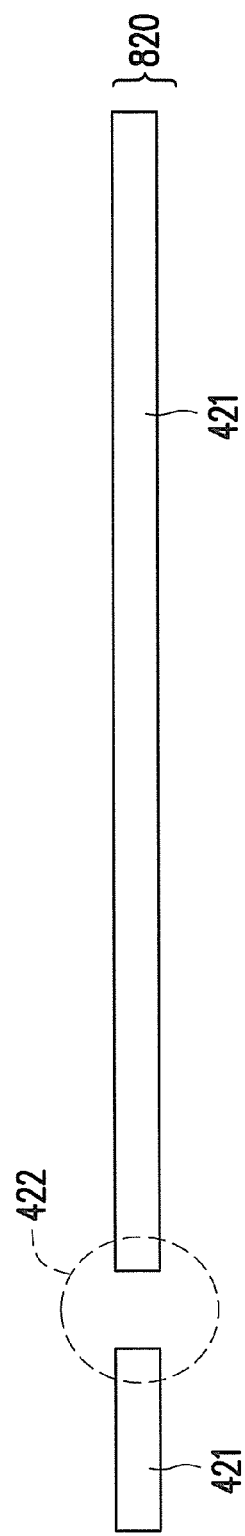
FIG. 7 is a cross-sectional diagram of a structure of an insulating substrate including the light path according to yet another embodiment of the present disclosure.
Figure 8:
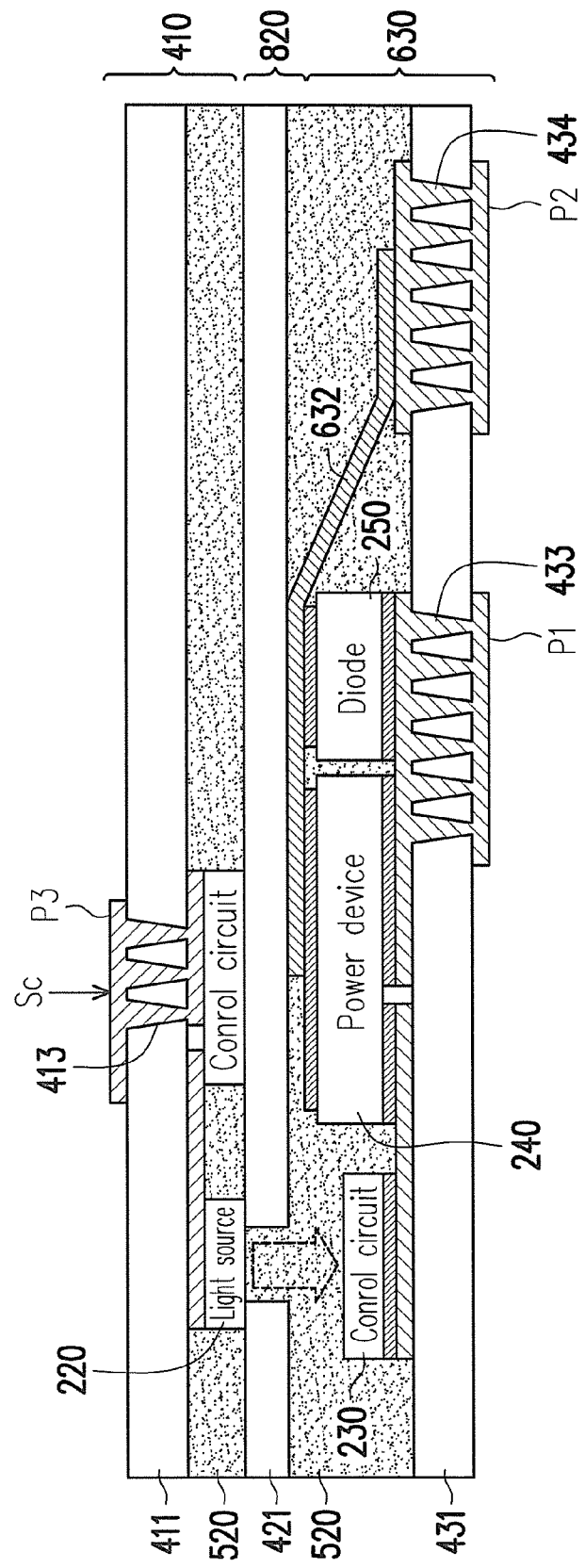
FIG. 8 is a cross-sectional diagram of a structure of the power module for high/low voltage insulation depicted in FIG. 2 according to yet another embodiment of the present disclosure.

FIGS. 7 and 8 illustrate another implementation of the power module 300 for high/low voltage insulation depicted in FIG. 2. FIG. 7 is a cross-sectional diagram of a structure of an insulating substrate 820 including the light path 422 according to yet another embodiment of the present disclosure. The insulating substrate 820 can be a ceramic interposer, a glass interposer or other substrates with high resistance characteristic. The insulating substrate 820 includes the substrate 421. The embodiment depicted in FIG. 7 may be inferred with reference to related description for FIGS. 3B and 5A, so it is omitted hereinafter. A difference between the present embodiment and the embodiment depicted in FIG. 5A is that, the transparent component 423 depicted in FIG. 5A is omitted in the insulating substrate 820 depicted in FIG. 7.

The first substrate 410 depicted in FIG. 3A, the insulating substrate 820 depicted in FIG. 8 and the second substrate 630 depicted in FIG. 5B can be stacked to realize the power module 300 for high/low voltage insulation depicted in FIG. 2. For instance, FIG. 8 is a cross-sectional diagram of a structure of the power module 300 for high/low voltage insulation depicted in FIG. 2 according to yet another embodiment of the present disclosure. The embodiment depicted in FIG. 8 may be inferred with reference to related description for FIGS. 1, 2, 3A, 5B, 6 and/or 7, so it is omitted hereinafter.

An example of manufacturing the power module 300 for high/low voltage insulation depicted in FIG. 8 is described below. In the present embodiment, nano-silver paste is served as an exemplary material for the conductive interface. First, the first substrate 410 depicted in FIG. 3A, the insulating substrate 820 depicted in FIG. 7 and the second substrate 630 depicted in FIG. 5B are manufactured. Therein, the nano-silver is coated on the connecting terminals of the second control circuit 230, the power device 240, the diode 250 (or the nano-silver paste is printed on corresponding locations on the substrate 431), and then the second control circuit 230, the power device 240, the diode 250 are bonded on the corresponding locations on the substrate 431. Subsequently, the first end of the conductive wire 632 (e.g., the aluminum strip) is pressed to the second control circuit 230 and the power device 240, and the second end of the conductive wire 632 is pressed to the second conductive through via structure 434. Thus, manufacturing of the second substrate 630 is completed. Lastly, after the first substrate 410, the insulating substrate 620 and the second substrate 630 are stacked and assembled, a material (a molding material) of the dielectric layer 520 is introduced, and followed by pressurizing and baking so that the nano-silver is sintered to complete an interconnection.

Materials of the first dielectric layer 510 and/or the second dielectric layer 520 can be a material that is non-conductive and transparent. After the material of the dielectric layer is introduced, the material of the dielectric layer is then filled in the though hole of the substrate 421 of the insulating substrate 820, so as to provide the light path. Therefore, the light of the light source 220 of the first substrate 410 can be transmitted to the light-sensing part of the second control circuit 230 of the second substrate 630 through the material of the dielectric layer in the through hole of the substrate 421.

Figure 9:
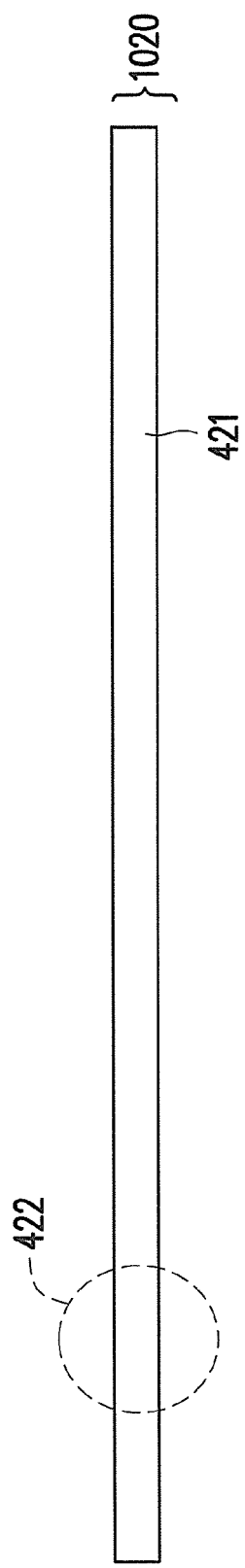
FIG. 9 is a cross-sectional diagram of a structure of an insulating substrate including the light path according to still another embodiment of the present disclosure.
Figure 10:
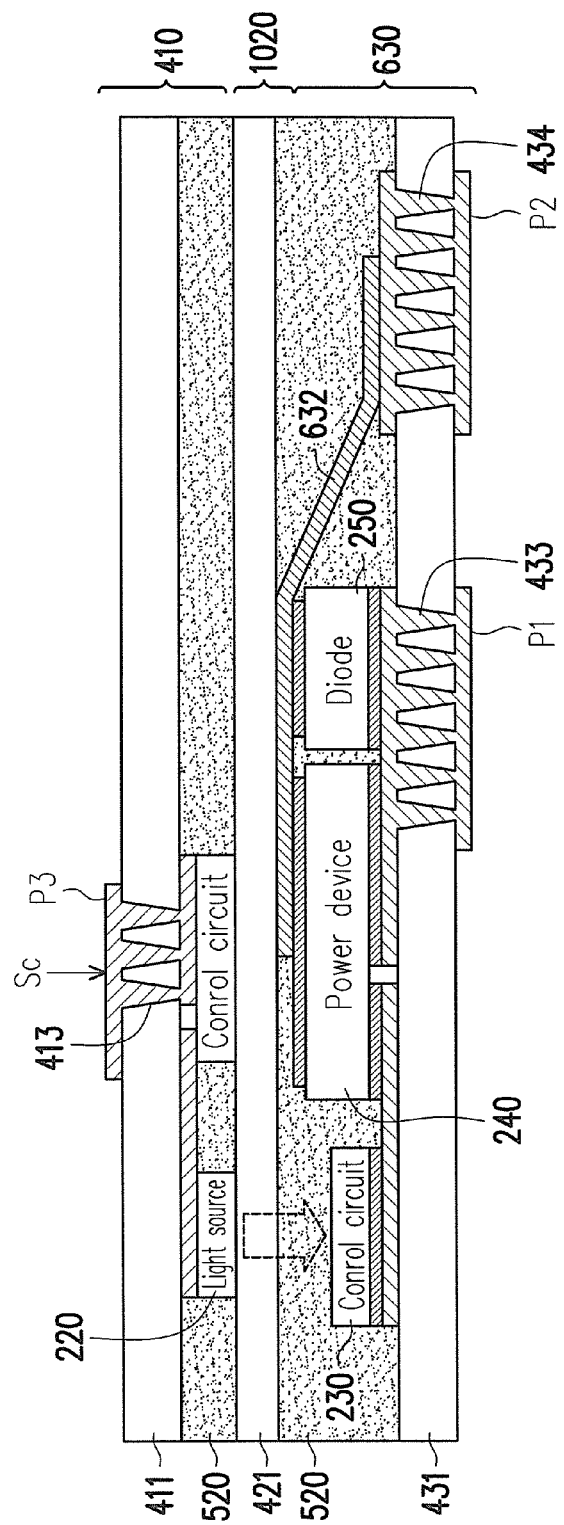
FIG. 10 is a cross-sectional diagram of a structure of the power module for high/low voltage insulation depicted in FIG. 2 according to still another embodiment of the present disclosure.

FIGS. 9 and 10 illustrate yet another implementation of the power module 300 for high/low voltage insulation depicted in FIG. 2. FIG. 9 is a cross-sectional diagram of a structure of an insulating substrate 1020 including the light path 422 according to still another embodiment of the present disclosure. The embodiment depicted in FIG. 9 may be inferred with reference to related description for FIGS. 3B, 5A and 7, so it is omitted hereinafter. A difference between the present embodiment and the embodiment depicted in FIG. 7 is that, the through hole depicted in FIG. 7 is omitted in the insulating substrate 1020 depicted in FIG. 9. In the present embodiment, a material of the substrate 421 of an insulating substrate 1020 is a transparent material or a semi-transparent, such as glass, plastic or other possible substrate or other transparent materials. In case the insulating substrate 1020 is transparent (i.e., the light path 422 is provided), the through hole is not required to be disposed on the substrate 421.

The first substrate 410 depicted in FIG. 3A, the insulating substrate 1020 depicted in FIG. 9 and the second substrate 630 depicted in FIG. 5B can be stacked to realize the power module 300 for high/low voltage insulation depicted in FIG. 2. For instance, FIG. 10 is a cross-sectional diagram of a structure of the power module 300 for high/low voltage insulation depicted in FIG. 2 according to still another embodiment of the present disclosure. The embodiment depicted in FIG. 10 may be inferred with reference to related description for FIGS. 1, 2, 3A, 5B, 7 and/or 9, so it is omitted hereinafter. The power module 300 for high/low voltage insulation depicted in FIG. 10 may refer to related description for FIG. 8. The material of the first dielectric layer 510 and/or the second dielectric layer 520 can be a material that is non-conductive and transparent. After the material of the dielectric layer 520 is introduced, the light path is provided by the substrate 421 and the second dielectric layer 520 in the insulating substrate 1020. Therefore, the light of the light source 220 of the first substrate 410 can be transmitted to the light-sensing part of the second control circuit 230 of the second substrate 630 through the substrate 421 and the second dielectric layer 520.

Figure 11:
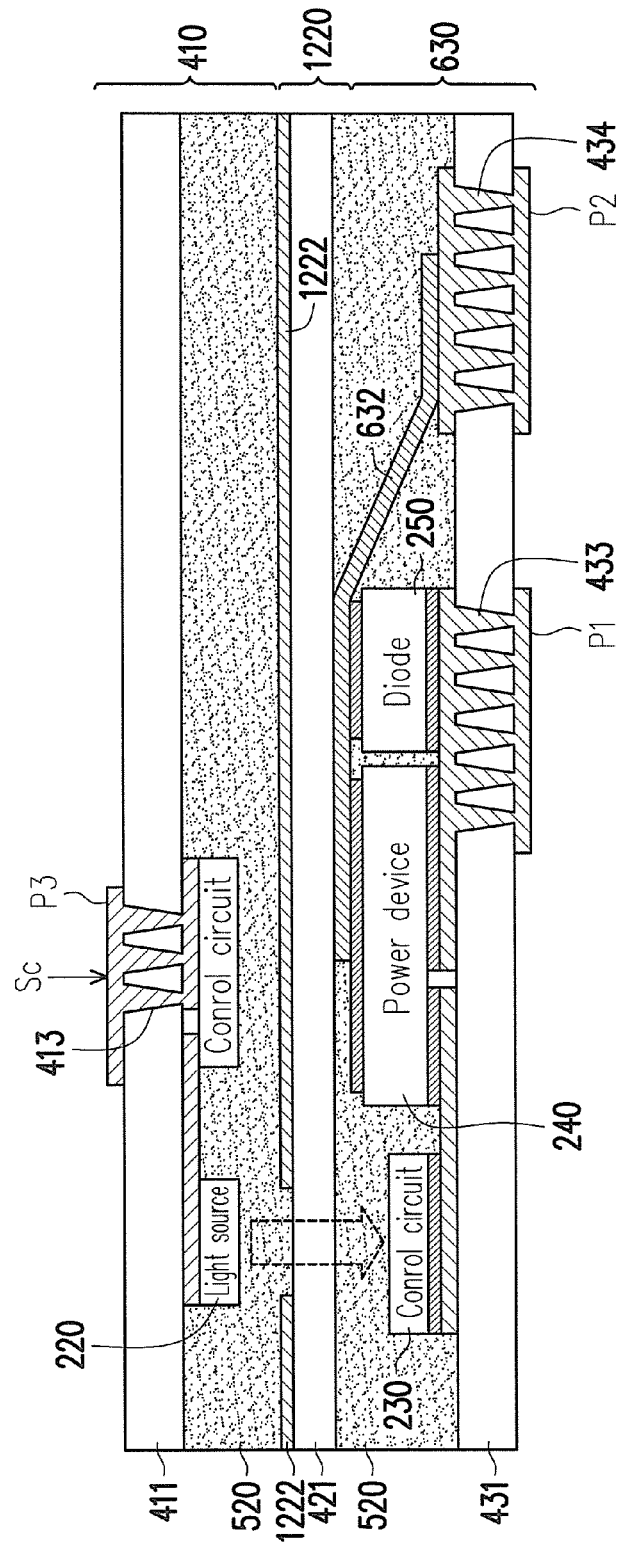
FIG. 11 illustrates another implementation of the power module for high/low voltage insulation depicted in FIG. 2 according to again another embodiment of the present disclosure.

FIG. 11 illustrates another implementation of the power module 300 for high/low voltage insulation depicted in FIG. 2 according to again another embodiment of the present disclosure. A insulating substrate 1220 depicted in FIG. 11 may refer to related description for FIG. 9. A difference between the present embodiment and the embodiment depicted in FIG. 9 is that, the insulating substrate 1220 depicted in FIG. 11 further includes a metal shielding layer 1222. The metal shielding layer 1222 can serve as an electric field shielding layer between the first substrate 410 and the second substrate 630. The metal shielding layer 1222 is provided with a through hole. Since the insulating substrate 1020 and the material of the dielectric layer 520 are transparent (i.e., the light path 422 is provided), the light of the light source 220 of the first substrate 410 can be transmitted to the light-sensing part of the second control circuit 230 of the second substrate 630 through the first dielectric layer 510, the substrate 421 and the second dielectric layer 520.

In summary, in the present embodiment, the low voltage domain circuit is disposed on the first substrate 410, the high voltage domain circuit is disposed on the second substrate 630, and the insulating substrate 620 is disposed between the first substrate 410 and the second substrate 630, such that the low voltage domain circuit and the high voltage domain circuit can be effectively insulated. The insulating substrate 620 is capable of enhancing a long term reliability of the power module 300 for high/low voltage insulation. Besides, since there is no electrical connection between the first substrate 410 in the low voltage domain and the second substrate 630 in the high voltage domain, an electrical kickback to the first control circuit 210 in the low voltage domain occurred during operation of power device 240 and the diode 250 can be solved, so as to prevent function failures of the power module 300 for high/low voltage insulation. Moreover, when the power module 300 for high/low voltage insulation is composed by having all components embedded, an electrical transmission path between the components can be effectively reduced to provide an effect of miniaturization in packaging size.

It will be apparent to those skilled in the art that various modifications and variations can be made to the structure of the disclosed embodiments without departing from the scope or spirit of the present disclosure. In view of the foregoing, it is intended that the disclosure cover modifications and variations of this disclosure provided they fall within the scope of the following claims and their equivalents.

What is claimed is:

1. A power module for high/low voltage insulation, comprising:
   a first substrate including a first control circuit and a light source, wherein the first control circuit controls the light source to emit light;
   a second substrate disposed at a side of the first substrate, and the second substrate including:
      a power device;
      a light-sensing part receiving the light of the light source of the first substrate to send sensing information; and
      a second control circuit correspondingly driving the power device in accordance with the sensing information; and
   an insulating substrate disposed between the first substrate and second substrate.

2. The power module for high/low voltage insulation according to claim 1, wherein the first substrate and the second substrate are not electrically connected.

3. The power module for high/low voltage insulation according to claim 1, wherein a wavelength of the light of the light source is between 300 nm to 1000 nm.

4. The power module for high/low voltage insulation according to claim 1, wherein the light source is a light emitting diode.

5. The power module for high/low voltage insulation according to claim 1, wherein the power device comprises a control terminal, a first terminal and a second terminal, and the control terminal of the power device is coupled to the second control circuit.

6. The power module for high/low voltage insulation according to claim 5, wherein the insulating substrate further comprises a conductive layer located at a side of the insulating substrate adjacent to the second substrate, and the second terminal of the power device is electrically connected to the conductive layer.

7. The power module for high/low voltage insulation according to claim 6, wherein the second terminal of the power device is connected to the conductive layer of insulating substrate through a first conductive interface, wherein the first conductive interface includes metal glue, metal paste, nano-silver paste, tin or other conductive materials.

8. The power module for high/low voltage insulation according to claim 5, wherein the power device comprises at least one insulated gate bipolar transistor (IGBT), the control terminal of the power device being a gate of the IGBT, and the first terminal and the second terminal of the power device respectively being an emitter and a collector of the IGBT.

9. The power module for high/low voltage insulation according to claim 5, further comprising:
   a diode having an anode and a cathode, wherein the anode and the cathode are electrically connected to the first terminal and the second terminal of the power device, respectively.

10. The power module for high/low voltage insulation according to claim 1, wherein an operating voltage of the power device is greater than 10 times an operating voltage of the first substrate.

11. The power module for high/low voltage insulation according to claim 1, wherein the first substrate or the second substrate are a direct bond copper ceramic substrate, a copper electroplating ceramic substrate or a printed circuit board.

12. The power module for high/low voltage insulation according to claim 1, wherein the insulating substrate is a ceramic interposer or a glass interposer.

13. The power module for high/low voltage insulation according to claim 1, wherein the insulating substrate further comprising:
   a through hole, wherein the light of the light source of the first substrate is transmitted to the light-sensing part of the second control circuit of the second substrate through the through hole.

14. The power module for high/low voltage insulation according to claim 13, wherein the insulating substrate further comprising:
   a transparent component disposed in the through hole, wherein the light of the light source of the first substrate is transmitted to the light-sensing part of the second control circuit of the second substrate through the transparent component.

15. The power module for high/low voltage insulation according to claim 14, wherein a length of the transparent component is greater than a thickness of the insulating substrate.

16. The power module for high/low voltage insulation according to claim 14, wherein a material of the transparent component comprises glass, plastic or other transparent materials.

17. The power module for high/low voltage insulation according to claim 1, wherein a material of the insulating substrate is a transparent material or a semi-transparent material.

18. The power module for high/low voltage insulation according to claim 17, wherein the insulating substrate further comprising:
   a metal shielding layer located at a side of the insulating substrate adjacent to the first substrate, and the metal shielding layer having a through hole;
   wherein the light of the light source of the first substrate is transmitted to the light-sensing part of the second substrate through the through hole and the insulating substrate.

19. The power module for high/low voltage insulation according to claim 1, further comprising:
   a first dielectric layer disposed between the first substrate and the insulating substrate; and
   a second dielectric layer disposed between the second substrate and the insulating substrate;
   wherein a material of the first dielectric layer or the second dielectric layer is high-molecular material.

20. The power module for high/low voltage insulation according to claim 19, wherein the high-molecular material comprises silica gel, prepreg, ABF or polymide.

* * * * *